(12) United States Patent
Onuki et al.

(10) Patent No.: US 9,331,121 B2
(45) Date of Patent: May 3, 2016

(54) METHOD OF MANUFACTURING PHOTOELECTRIC CONVERSION APPARATUS INCLUDING PIXEL WELL CONTACT

(71) Applicant: CANON KABUSHIKI KAISHA, Tokyo (JP)

(72) Inventors: Yusuke Onuki, Fujisawa (JP); Hiroaki Naruse, Oita (JP); Masashi Kusukawa, Sagamihara (JP); Katsunori Hirota, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/532,160

(22) Filed: Nov. 4, 2014

(65) Prior Publication Data

US 2015/0147843 A1 May 28, 2015

(30) Foreign Application Priority Data

Nov. 22, 2013 (JP) .................................. 2013-242363

(51) Int. Cl.
  *H01L 27/146* (2006.01)
  *H01L 21/265* (2006.01)

(52) U.S. Cl.
  CPC ........ *H01L 27/14689* (2013.01); *H01L 21/265* (2013.01); *H01L 27/14643* (2013.01)

(58) Field of Classification Search
  USPC ............................................. 438/59; 257/222
  See application file for complete search history.

(56) References Cited

U.S. PATENT DOCUMENTS

| | | |
|---|---|---|
| 6,504,194 B1 | 1/2003 | Miida |
| 6,656,777 B2 | 12/2003 | Miida |
| 6,677,627 B2 | 1/2004 | Miida |
| 7,016,089 B2 | 3/2006 | Yoneda et al. |
| 7,348,615 B2 | 3/2008 | Koizumi |
| 7,616,355 B2 | 11/2009 | Yoneda et al. |
| 7,679,114 B2 | 3/2010 | Koizumi |
| 7,864,384 B2 | 1/2011 | Yoneda et al. |
| 7,936,487 B2 | 5/2011 | Yoneda et al. |
| 7,939,868 B2 | 5/2011 | Koizumi |

(Continued)

FOREIGN PATENT DOCUMENTS

| | | |
|---|---|---|
| JP | 2001-223351 A | 8/2001 |
| JP | 2001-230400 A | 8/2001 |

(Continued)

*Primary Examiner* — Jerome Jackson, Jr.
*Assistant Examiner* — Charles R Peters
(74) *Attorney, Agent, or Firm* — Fitzpatrick, Cella, Harper & Scinto

(57) ABSTRACT

A method of manufacturing a photoelectric conversion apparatus which includes a pixel circuit section having a well where a photoelectric conversion element and an amplification element configured to generate a signal based on an amount of charge generated in the photoelectric conversion element are arranged, and a peripheral circuit section having a MOS transistor. The method includes forming a dielectric film for covering the photoelectric conversion element, the amplification element, and a gate electrode of the MOS transistor and forming, by etching the dielectric film, a side spacer by remaining a portion of the dielectric film on a side surface of the gate electrode while protecting by a resist, wherein an opening is formed in the dielectric film of the pixel circuit section with the etching, and a contact for defining a potential of the well is formed through the opening.

14 Claims, 5 Drawing Sheets

(56) References Cited

U.S. PATENT DOCUMENTS

| | | |
|---|---|---|
| 8,248,677 B2 | 8/2012 | Yoneda et al. |
| 8,274,105 B2 | 9/2012 | Koizumi |
| 8,416,473 B2 | 4/2013 | Yoneda et al. |
| 8,860,099 B2 | 10/2014 | Tatani et al. |
| 2010/0330723 A1* | 12/2010 | Okabe et al. .................. 438/59 |
| 2011/0073923 A1 | 3/2011 | Tatani et al. |
| 2012/0273854 A1* | 11/2012 | Velichko et al. ............. 257/290 |
| 2012/0319224 A1 | 12/2012 | Koizumi |

FOREIGN PATENT DOCUMENTS

| | | |
|---|---|---|
| JP | 2005-302836 A | 10/2005 |
| JP | 2006-041080 A | 2/2006 |
| JP | 2006-073737 A | 3/2006 |
| JP | 2011-071347 A | 4/2011 |

* cited by examiner

METHOD OF MANUFACTURING PHOTOELECTRIC CONVERSION APPARATUS INCLUDING PIXEL WELL CONTACT

BACKGROUND OF THE INVENTION

1. Field of the Invention

The present invention relates to a method of manufacturing a photoelectric conversion apparatus including a MOS transistor.

2. Description of the Related Art

A photoelectric conversion apparatus is used in an image capturing apparatus such as a digital still camera or a video camcorder, and demand for this is increasing. Especially in recent years, as for the photoelectric conversion apparatus used in the digital still camera, a large size such as an APS-C size or a 35-mm film size is becoming widely used. MOS photoelectric conversion apparatuses are used as these photoelectric conversion apparatuses. In the MOS photoelectric conversion apparatuses, it is necessary to reduce noise generated in pixel circuit sections.

A change in density level called shading may occur in the output signal of a photoelectric conversion apparatus. An optical charge generated upon incidence of light on a photoelectric conversion element is converted into a voltage, and becomes an electrical signal. For the electrical signal as a voltage, an electrical signal component is added to the reference potential of a semiconductor substrate. For this reason, when the reference potential of the semiconductor takes different values depending on positions within an imaging area, the output signal of the photoelectric conversion apparatus takes different values accordingly even if the intensity of light entering the photoelectric conversion apparatus is constant. As a result, the change in density level which appears in the output image of the photoelectric conversion apparatus is called shading. In the case of a sensor having an imaging area of a large size demand of which is increasing in recent years as described above, shading greatly impairs the performance of the sensor. As a method of reducing this shading, Japanese Patent Laid-Open No. 2006-073737 discloses a method of providing a well contact for supplying a reference voltage to the common well of a pixel section.

SUMMARY OF THE INVENTION

One aspect of the present invention provides a method of manufacturing a photoelectric conversion apparatus which includes a pixel circuit section having a well where a photoelectric conversion element and an amplification element configured to generate a signal based on an amount of charge generated in the photoelectric conversion element are arranged, and a peripheral circuit section having a MOS transistor. The method includes forming a dielectric film for covering the photoelectric conversion element, the amplification element, and a gate electrode of the MOS transistor and forming, by etching the dielectric film, a side spacer by remaining a portion of the dielectric film on a side surface of the gate electrode while protecting, by a resist, the photoelectric conversion element and the amplification element covered by the dielectric film, wherein an opening is formed in the dielectric film of the pixel circuit section with the etching, and a contact for defining a potential of the well is formed through the opening.

Further features of the present invention will become apparent from the following description of exemplary embodiments (with reference to the attached drawings).

DESCRIPTION OF THE EMBODIMENTS

Figure 1A:
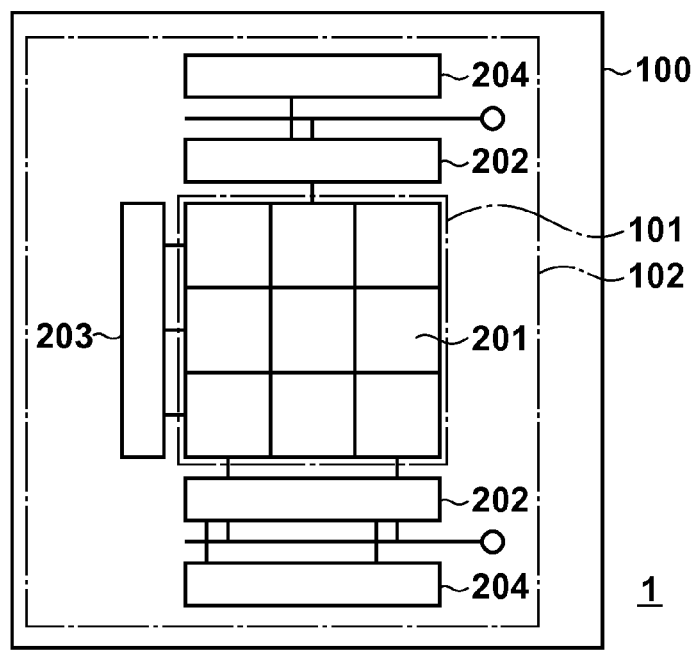
FIGS. 1A and 1B show schematic plan views of examples of a photoelectric conversion apparatus according to the present invention.

The present invention provides a method of manufacturing a photoelectric conversion apparatus advantageous in forming the well contact of a pixel circuit section.

An embodiment of the present invention will be described in detail below by way of an example with reference to drawings. The present invention is not limited to the example, but can be combined and changed without departing from the scope of the present invention. Note that in the description and the drawings below, the same arrangement is given the same reference numerals throughout the plurality of drawings. Therefore, the same arrangement will be described with cross-reference to the plurality of drawings, and the description of the arrangement given the same reference numerals will be omitted as appropriate.

In FIG. 1A is a plan view showing an example of a photoelectric conversion apparatus. A photoelectric conversion apparatus 1 includes a pixel circuit section 101 in which pixel circuits 201 are arranged, and a peripheral circuit section 102 in which peripheral circuits 202, 203, and 204 are arranged. The pixel circuit section 101 and the peripheral circuit section 102 are provided on a single semiconductor substrate 100.

Figure 1B:
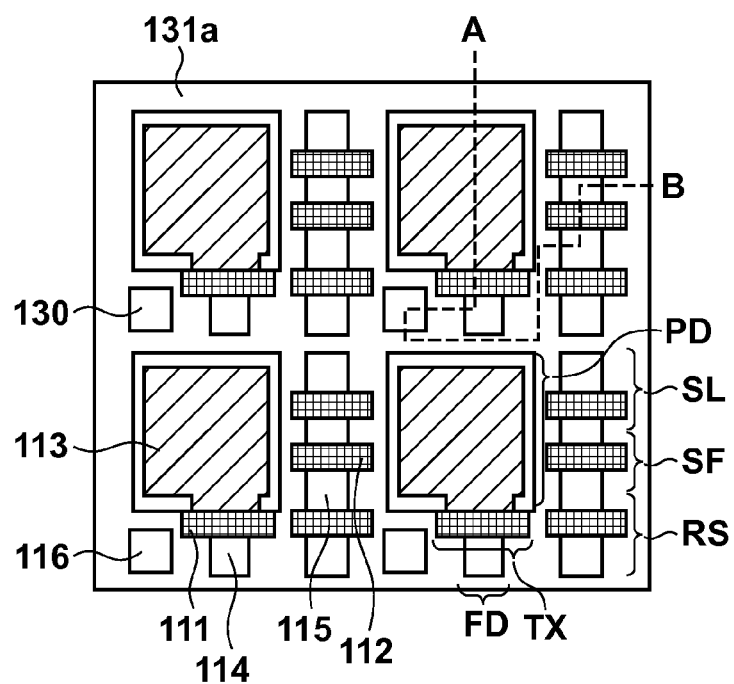

In FIG. 1B is a plan view showing an example of four pixel circuits 201 in the pixel circuit section 101. Each pixel circuit 201 is one unit made of a photoelectric conversion element PD such as a photodiode, and a readout circuit which reads out a signal from the photoelectric conversion element PD. The pixel circuit section 101 is a region where the plurality of such pixel circuits 201 are arranged. A pixel is the minimum unit of the photoelectric conversion element PD and an element group which forms a circuit for reading out an image signal from this photoelectric conversion element PD to an output line. Each pixel circuit 201 has an amplification element SF which generates a signal based on an amount of charge generated in the photoelectric conversion element PD. Such photoelectric conversion apparatus 1 is a pixel amplification type image capturing apparatus. For example, a transfer element TX, a capacitive element FD, the amplification element SF, and a reset element RS are included in this element group. In this example, a selection element SL is also included in the element group. The above-mentioned elements can be shared with the adjacent photoelectric conversion elements PD. In this case as well, however, the pixel can be defined by the minimum unit of the element group for reading out the signal of the photoelectric conversion elements PD. Note that in order to implement focus detection of a phase difference detection method, it is also possible to provide the plurality of photoelectric conversion elements PD in one pixel, and treat a signal from the pixel as a signal obtained by combining signals from the plurality of photoelectric conversion elements PD.

As shown in FIG. 1A, the peripheral circuit section 102 includes the signal processing circuits 202, the vertical shift resistor 203, and the horizontal shift resistors 204. Each signal processing circuit 202 is a circuit which amplifies a signal read out from the pixel circuits 201 and removes pixel noise by CDS processing. Alternatively, each signal processing circuit 202 may be a circuit for converting a plurality of signals read out in parallel from the two-dimensionally arranged pixels on the row basis into serial signals to output them outside. The vertical shift resistor 203 is a driving circuit for driving the pixel circuits 201 arranged in the pixel circuit section 101 by selecting them on the row basis. Each horizontal shift resistor 204 is a circuit for driving each signal processing circuit 202 and transferring a signal from the signal processing circuit 202 outside. When performing A/D conversion in the photoelectric conversion apparatus 1, a peripheral circuit may include an A/D conversion circuit.

Figure 2:
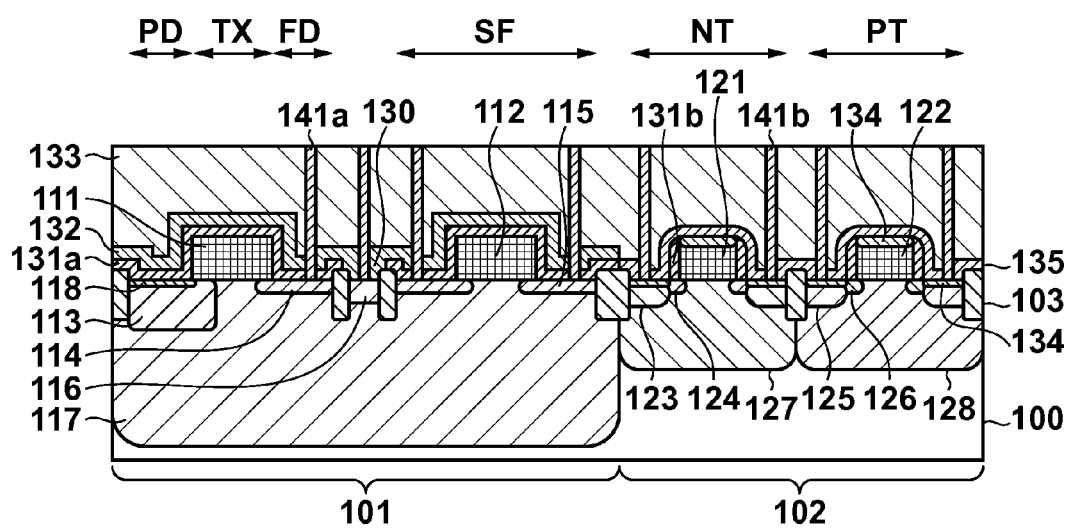
FIG. 2 is a schematic sectional view showing an example of the photoelectric conversion apparatus according to the present invention.

First, the photoelectric conversion apparatus 1 according to the present invention will be described with reference to FIG. 2. FIG. 2 is a schematic sectional view taken along a line A-B in FIG. 1B. In this example, the photodiode as the photoelectric conversion element PD, a MOS gate as the transfer element TX, and a MOS field effect transistor (MOSFET) as the amplification element will be described as an example of the elements arranged in the pixel circuit section. Only specific elements will be exemplified in the example. It is possible, however, to apply structures in the example to other elements arranged in the pixel circuit 201. A transistor which forms the pixel circuit 201 is generically referred to as a pixel transistor. The pixel transistor is not limited to the MOS field effect transistor (MOSFET), but may be a junction field effect transistor (JFET) or a bipolar transistor. On the other hand, a transistor which forms the peripheral circuits is generically referred to as a peripheral transistor. The peripheral transistor includes the MOS field effect transistor (the MOSFET or the MOS transistor). Elements other than the MOSFET, for example, a resistive element and a capacitive element can be arranged in the peripheral circuit section 102. The MOS field effect transistor will be referred to as the MOS transistor hereinafter. Note that the MOS field effect transistor is equivalent to an insulated gate field effect transistor. The type of a gate insulation film is not limited to an oxide film.

The photoelectric conversion apparatus 1 includes the pixel circuit section 101 and the peripheral circuit section 102. In FIG. 2, the sectional structures of the photoelectric conversion element PD, the transfer element TX, and the amplification element SF in the pixel circuit section 101 are shown. The peripheral transistor shown in the peripheral circuit section 102 is shown as a transistor for forming any of the circuits such as the signal processing circuits 202, the vertical shift resistor 203, the horizontal shift resistors 204, and the A/D conversion circuit.

An element isolation region 103 formed by, for example, STI or local oxidation of silicon (LOCOS) is arranged on the semiconductor substrate 100 of silicon or the like. A gate electrode 111 of a transfer MOS gate and a gate electrode 112 of the amplification element SF are formed in the pixel circuit section 101. An impurity region 113 of a first conductivity type functions as the charge accumulation region of the photoelectric conversion element PD. The first conductivity type is a conductivity type which matches a conductivity type by which an optical charge (signal charge) treated as a signal by the photoelectric conversion element PD is regarded as a majority carrier. The first conductivity type becomes an n type when an electron is used as the signal charge. An impurity region 118 of a second conductivity type to have the photoelectric conversion element PD in a buried structure is formed between the surface of the semiconductor substrate 100 and the impurity region 113. The second conductivity type is a conductivity type which is opposite to the first conductivity type, and becomes a p type when the electron is used as the signal charge. An impurity region 114 of the first conductivity type functions as the floating diffusion of the capacitive element FD. A transistor which is formed assuming that the gate electrode 111 is a gate, the impurity region 113 is the source of the transistor, and the impurity region 114 is the drain of the transistor can also be referred to as a transfer transistor. An impurity region 115 of the first conductivity type forms the drain or the source of the amplification element SF having a single drain structure. A power supply potential is applied to the drain of the amplification element SF. A current source is connected to the source of the amplification element SF through the selection element SL (not shown), and the amplification element SF forms a source follower circuit. The impurity region 114 is connected to the drain of the reset element RS (not shown). The impurity region 114 is also connected to the gate electrode 112 of the amplification element SF. A reset potential is applied to the source of the reset element RS. The potentials of the impurity region 114 and the gate electrode 112 are reset by turning on the gate of the reset element RS. A pixel may be selected not by using the selection element SL but by controlling the power supply potential of the amplification element SF. The reset potential and the power supply potential may be shared.

A potential serving as a reference for defining the potential of a second conductivity type well 117 (well potential) is applied to an impurity region 116 of the second conductivity type. The well potential is, for example, a ground potential. The impurity region 116 forms at least part of a well contact for defining the well potential. When the electron is used as the signal charge of the photoelectric conversion element PD, the impurity region 116 is a p-type impurity region as in the well 117. The impurity region 116 is surrounded by an insulator for element isolation which forms the element isolation region 103, and formed in an active region other than the active regions of the photoelectric conversion element PD and the amplification element SF. It is also possible, however, to provide the impurity region 116 in the same active region as the active regions of the photoelectric conversion element PD and the amplification element SF. It is possible to provide one well contact per one pixel circuit 201. It is also possible, however, to provide one well contact per the plurality of pixel circuits 201.

A dielectric film 131a which covers the photoelectric conversion element PD and the amplification element SF is provided in the pixel circuit section 101. The dielectric film 131a further covers the transfer element TX, the capacitive element FD (impurity region 114), the reset element RS, and the selection element SL. More specifically, the dielectric film 131a covers the upper surface of the gate electrode 111 of the transfer element TX, and the upper surface of the gate electrode 112 of the amplification element SF. Similarly, the dielectric film 131a covers the gate electrode of the reset element RS and the gate electrode of the selection element SL. The dielectric film 131a made of a multi-layered film including a silicon oxide layer and a silicon nitride layer can function as an antireflection film which reduces the reflection of incident light on the surface of the photoelectric conversion element PD. Note that the dielectric film 131a may be the multi-layered film of a combination other than the combination of the silicon nitride layer and the silicon oxide layer, or may be a single layer film. The dielectric film 131a has an opening 130 positioned on the impurity region 116. An insulation film 132 which is a single layer film made of the silicon oxide layer covering the pixel circuit section 101 plays a role in protecting the pixel circuit section 101 from metal contamination caused by a silicide such as a cobalt silicide when forming a silicide electrode in the peripheral circuit section 102. The insulation film 132 may be a single layer film made of the silicon nitride layer or may be a multi-layered film.

A plurality of peripheral transistors including the MOS transistor of the first conductivity type and the MOS transistor of the second conductivity type are arranged in the peripheral circuit section 102. In some cases, a MOS transistor NT of the first conductivity type and a MOS transistor PT of the second conductivity type form a CMOS circuit in the peripheral circuit section 102. A gate electrode 121 is the gate electrode of the peripheral transistor of the first conductivity type, and a gate electrode 122 is the gate electrode of the peripheral transistor of the second conductivity type. Each peripheral transistor has a LDD structure. That is, the source and drain of the peripheral transistor of the first conductivity type are formed including an impurity region 123 of the first conductivity type and an impurity region 124 of the first conductivity type whose impurity concentration is lower than that of the impurity region 123. Likewise, the source and drain of the peripheral transistor of the second conductivity type are formed including an impurity region 125 of the second conductivity type and an impurity region 126 of the second conductivity type whose impurity concentration is lower than that of the impurity region 125.

Side spacers 131b each of which is a multilayer made of the silicon oxide layer and the silicon nitride layer are formed on the side surfaces of the gate electrodes 121 and 122. The side spacer 131b is formed by a residue left upon etching the multilayered film made of the silicon oxide layer and the silicon nitride layer. The surface of the gate electrode, and the surfaces of the source and drain of each peripheral transistor are silicidized. For example, the cobalt silicide is used for silicidization. An insulation film 135 which is a multilayered film made of the silicon oxide layer and the silicon nitride layer covering the peripheral circuit section 102 is not limited to a multi-layered film of the combination of the silicon nitride layer and the silicon oxide layer, but may be a multi-layered film of another combination or a single layer film.

An insulation film 133 covers the pixel circuit section 101 and the peripheral circuit section 102. The upper surface of the insulation film 133 is flat. A wiring layer (not shown) is provided on the insulation film 133. The insulation film 133 functions as an interlayer insulation film for this wiring layer. The impurity regions of the respective elements of the pixel circuit 201 and an electrically conductive member such as a contact plug 141a connected to the gate electrode are provided in the pixel circuit section 101. The contact plug 141a is provided extending through the insulation film 133, the insulation film 132, and the dielectric film 131a. The dielectric film 131a functions as an etching stopper when forming a contact hole for the contact plug 141a. The impurity regions of the peripheral transistors and an electrically conductive member such as a contact plug 141b connected to the gate electrode are provided in the peripheral circuit section 102. The contact plug 141b is provided extending through the insulation film 133 and the insulation film 135. The insulation film 135 functions as an etching stopper when forming a contact hole for the contact plug 141b. The contact plugs 141a and 141b are formed by filling the contact holes formed by etching the insulation film 133 with an electrically conductive member such as tungsten. When the dielectric film 131a in the pixel circuit section 101 and a dielectric film which forms the side spacer 131b in the peripheral circuit section 102 adopt the same arrangement, a dielectric film can be formed on the surface of the photoelectric conversion apparatus 1 at once. This makes it possible to keep a manufacturing cost low.

The impurity region 116 of the second conductivity type is provided in the well 117 of the pixel circuit section 101. A reference potential (ground potential) is applied to the impurity region 116 in the well 117 through the contact plug 141a. By supplying the reference potential in the pixel circuit section 101, it is possible to reduce variations in the reference potential for each pixel circuit 201, and suppress shading. Assume that the source and drain of the MOS transistor adopt the single drain structure formed by an impurity region of a low impurity concentration. This makes it possible to suppress degradation in a transistor characteristic caused by a hot carrier as compared to adopting the LDD structure including impurity regions of high impurity concentrations in the source and drain. This effect becomes particularly prominent when the MOS transistor undergoes microfabrication. The degradation in the transistor characteristic caused by the hot carrier strongly depends on a gate length and a power supply voltage, and has a characteristic of causing significant degradation in a short gate length and a high power supply voltage. The MOS transistor having the single drain structure in the pixel circuit section according to this example can suppress the characteristic degradation at a high power supply voltage even if a fine MOS transistor having the short gate length is used.

On the other hand, in the peripheral circuit section 102, each peripheral transistor is a MOS transistor having the source and drain in the LDD structure formed by the impurity region of a high impurity concentration and the impurity region of a low impurity concentration. Hence, a high driving capability and a hot carrier resistance can be compatible with each other. Particularly, since an operation needs to be performed faster in the peripheral circuit section than in the pixel circuit section, it is important for each peripheral transistor to have the high driving capability. It is therefore important to differentiate, as in this example, the structure in an electric field reducing region of the MOS transistor in the pixel circuit section from that in the peripheral circuit section.

The dielectric film 131a in the pixel circuit section 101 may also be used as the etching stopper when performing anisotropic dry etching to form the contact hole. This avoids a contact from contacting the element isolation region and the well 117 on the side surface even if the contact overlaps on the element isolation region owing to misalignment. This makes it possible to suppress a leakage current between the impurity regions 114 and 115 of low impurity concentrations and the well 117. It is therefore possible to shorten a distance between the contact and the element isolation region, and miniaturize the elements.

A method of manufacturing the photoelectric conversion apparatus 1 according to this example will now be described. The flow of the manufacturing method is shown in FIG. 3A to FIG. 3I. Note that in FIG. 3A to FIG. 3I, the pixel circuit section 101 and the peripheral circuit section 102 are illustrated adjacent to each other for the sake of descriptive convenience.

First, a step in FIG. 3A will be described. The element isolation region 103 is formed by, for example, STI or local oxidation of silicon (LOCOS) on the semiconductor substrate 100 such as silicon. A well 128 of the first conductivity type (n-type), and the well 117 of the second conductivity type (p-type) and a well 127 of the second conductivity type (p-type) for forming elements are formed in the semiconductor substrate 100. The impurity region 113 of the first conductivity type (n-type) of the photoelectric conversion element PD is formed in the pixel circuit section 101 which forms the pixels. The impurity region 118 of the second conductivity type (p-type) is also formed on the surface of the photoelectric conversion element PD to have the photoelectric conversion element PD in the buried structure. The gate electrodes 111 and 112 are also formed on the semiconductor substrate 100. Furthermore, the impurity region 114 as the floating diffusion constituting the capacitive element FD, and the impurity region 115 to be the source or drain of the amplification element SF having the single drain structure in the pixel circuit section 101 are formed. At this time, the gate electrodes 111 and 112 can be used as masks. As a result, the impurity region 115 of the first conductivity type (n-type) of the amplification element SF having a low impurity concentration is formed. The gate electrode 121 and the gate electrode 122 of the MOS transistors to be the peripheral transistors are formed in the peripheral circuit section 102. By implanting an impurity in a region to be the LDD structure, the impurity region 124 of the first conductivity type of a low impurity concentration and the impurity region 126 of the second conductivity type of a low impurity concentration are formed. At this time as well, the gate electrodes 121 and 122 can be used as masks. An appropriate range of a dose amount for forming the impurity region 114, the impurity region 115, the impurity region 124, and the impurity region 126 is $5\times10^{12}$ to $5\times10^{14}$ [ions/cm$^2$], for example $1\times10^{13}$ to $1\times10^{14}$ [ions/cm$^2$]. Impurity implantation for forming the impurity regions 114 and 115 both of which are the first conductivity type, and impurity implantation for forming the impurity regions 124 and 126 can be performed simultaneously.

Figure 3A:
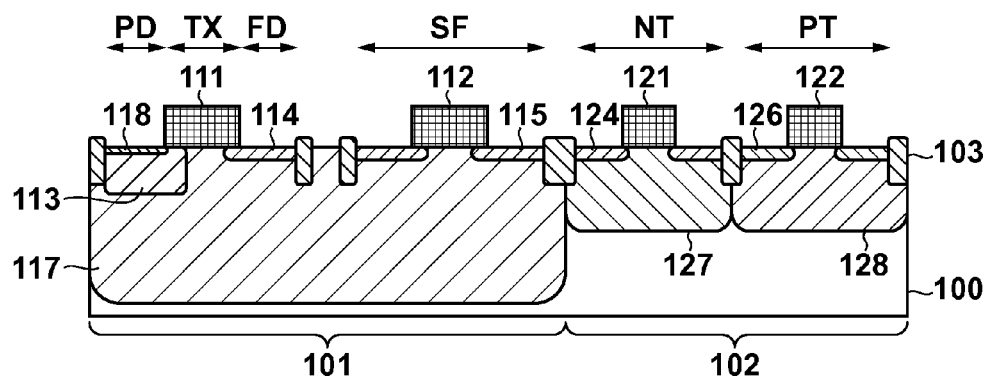
FIGS. 3A to 3I show schematic sectional views of a manufacturing process sequence showing an example of the photoelectric conversion apparatus according to the present invention.
Figure 3B:
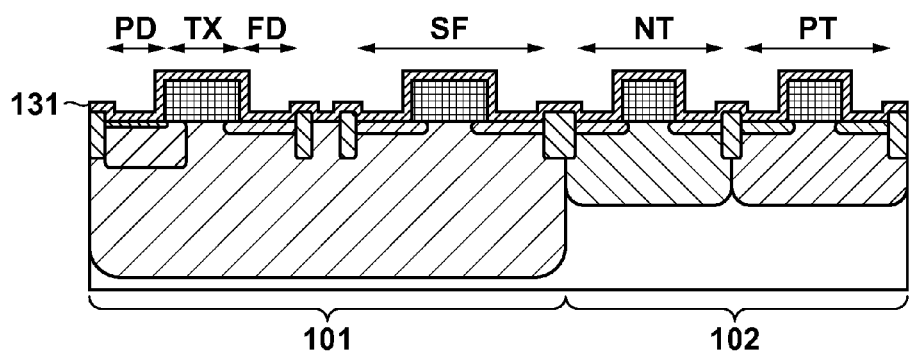

Following the step shown in FIG. 3A, a dielectric film 131 which is made of the silicon oxide layer and the silicon nitride layer covering the pixel circuit section 101 and the peripheral circuit section 102 is formed, as shown in FIG. 3B. The dielectric film 131 covers the photoelectric conversion element PD, the amplification element SF, and the gate electrodes of the peripheral transistors. The dielectric film 131 also covers the other pixel transistors such as the reset element RS and the selection element SL, the gate electrode 111 of the transfer element TX, and the impurity region 114 of the capacitive element FD. The dielectric film 131 as a multilayered film can use a multilayered film which includes the silicon nitride layer serving as the upper layer made to be thicker than the silicon oxide layer serving as the lower layer. It is possible to, for example, first form the silicon oxide layer with a thickness of 5 to 20 nm by a thermal CVD method, and then form the silicon nitride layer with a thickness of 20 to 100 nm by a plasma CVD method. The silicon nitride layer formed by the plasma CVD method can contain hydrogen in a large amount. Therefore, by performing annealing at 350° C. or more after forming the silicon nitride layer, the hydrogen which has been emitted from the silicon nitride layer serving as the upper layer and permeated through the silicon oxide layer serving as the lower layer diffuses into the semiconductor substrate 100, thereby obtaining a dangling bond termination effect. This makes it possible to reduce noise. The silicon oxide layer also functions as a layer which reduces the stress of the silicon nitride layer. By forming the silicon oxide layer, it is also possible to reduce plasma damage to the semiconductor substrate 100 when forming the silicon nitride layer by the plasma CVD method.

Figure 3C:
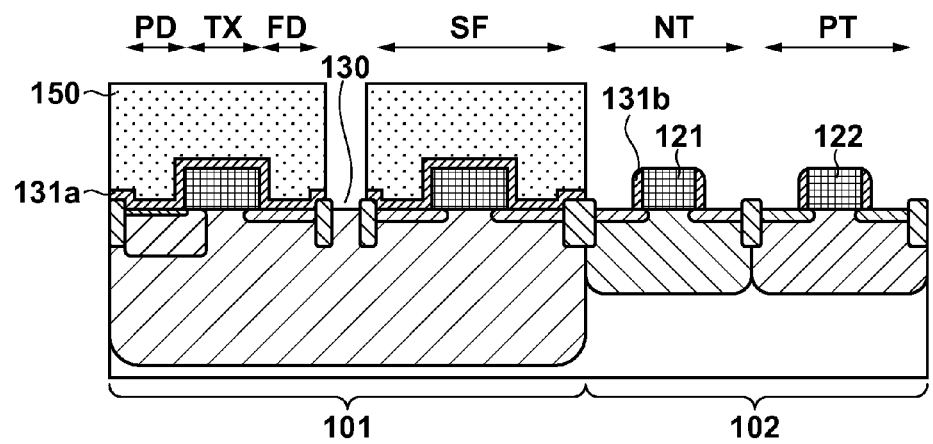

Next, as shown in FIG. 3C, a resist 150 is formed on the pixel circuit section except for a portion which is positioned above the impurity region 116 defining the well potential of the pixel circuit section 101, and the dielectric film 131 made of the silicon oxide layer and the silicon nitride layer is etched. A portion which is protected by the resist 150 and in which the dielectric film 131 covers the photoelectric conversion element PD and the amplification element SF remains as the dielectric film 131a. A portion out of the dielectric film 131 which covers the other pixel transistors such as the reset element RS and the selection element SL, the gate electrode 111 of the transfer gate, and the impurity region 114 also remains as the dielectric film 131a. On the other hand, in the peripheral circuit section 102 unprotected by the resist 150 is etched back while leaving a part of the dielectric film 131 on the side surfaces of the gate electrodes 121 and 122, thereby forming the side spacers 131b by the residue of the dielectric film 131. The residue serving as the side spacer 131b holds the multilayered structure of the silicon oxide layer and the silicon nitride layer. At this time, along with etching, the part of the dielectric film 131 is etched to form the opening 130 in the pixel circuit section 101. A portion of the dielectric film 131 positioned above an area where the impurity region 116 serving as the well contact to be formed is removed for forming this opening 130. After that, the well contact is formed through this opening 130. Damage to the semiconductor substrate 100 is suppressed by performing etching for forming the side spacer 131b and etching for forming the opening 130 simultaneously. Moreover, at this time, without etching the dielectric film 131 on the elements such as the photoelectric conversion element PD and the amplification element SF in the pixel circuit section 101, the addition of etching damage to these elements is avoided, thereby achieving a reduction in noise. This makes it possible to obtain a photoelectric conversion apparatus with an excellent noise characteristic because the etching damage to the photoelectric conversion element PD and the amplification element SF in particular can be the cause of a dark current and fixed-pattern noise.

Figure 3D:
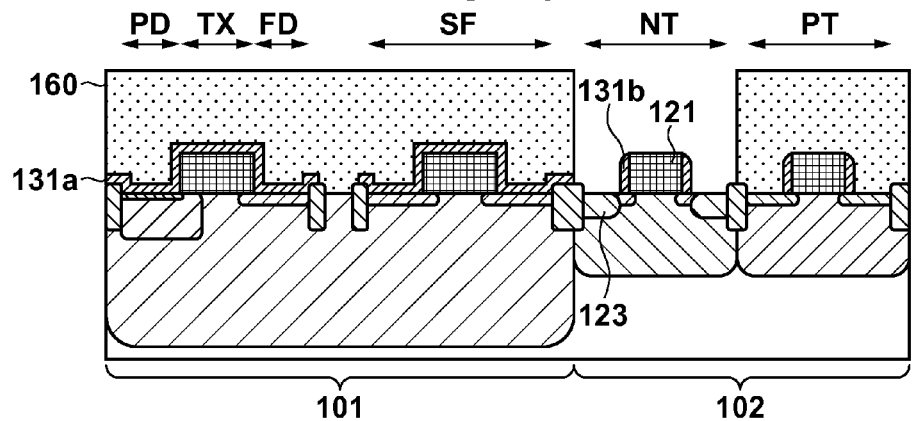

Next, as shown in FIG. 3D, a resist 160 is formed on the pixel circuit section 101 and the peripheral circuit section 102. At this time, the resist 160 is formed to have an opening in the portion of the MOS transistor of the first conductivity type (n-type or NT) in the peripheral circuit section 102. The impurity of the first conductivity type (n-type) is implanted using, as masks, the gate electrode 121 and the side spacer 131b of the MOS transistor of the first conductivity type (n-type) in the peripheral circuit section 102, and the resist 160. By doing so, the impurity region 123 of the first conductivity type to be the source or drain of a high impurity concentration in self alignment with the side surface of the side spacer 131b is formed.

Figure 3E:
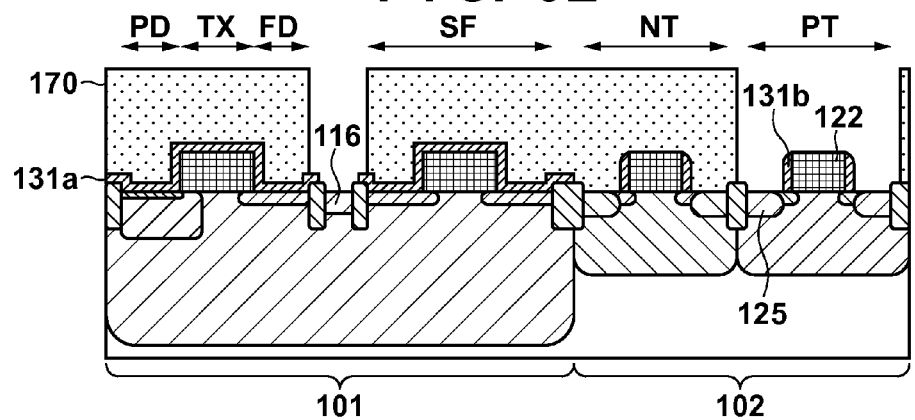

Similarly, as shown in FIG. 3E, a resist 170 is formed to have openings in the impurity region 116 of the pixel circuit section 101 and the portion of the MOS transistor of the second conductivity type (p-type or PT) of the peripheral circuit section 102. Then, the impurity of the second conductivity type (p-type) is implanted using, as masks, the gate electrode 122 and the side spacer 131b, and the resist 170. By this impurity implantation, the impurity region 125 of a high impurity concentration to be the source or drain in self alignment with the side surface of the side spacer is formed. At this time, by implanting the impurity of the second conductivity type (p-type) in the well 117 through the opening 130 simultaneously, the impurity region 116 serving as the well contact can be formed as the impurity region of the second conductivity type of a high impurity concentration. An appropriate range of a dose amount for forming the impurity region 123, the impurity region 125, and the impurity region 116 is $5\times10^{14}$ to $5\times10^{16}$ [ions/cm$^2$], for example $1\times10^{15}$ to $1\times10^{16}$ [ions/cm$^2$].

The above-described steps make it possible to adopt the LDD structure as the structure of the MOS transistor in the peripheral circuit section 102, and to increase the impurity concentration of the second conductivity type of the impurity region 116 serving as the well contact. Accordingly, the contact resistance of the impurity region 116 can be reduced. Impurity implantation for forming the impurity region serving as the well contact, and impurity implantation for forming the source or drain of the MOS transistor of the second conductivity type in the peripheral circuit section are performed at the same time. Annealing can also be performed after this.

Figure 3F:
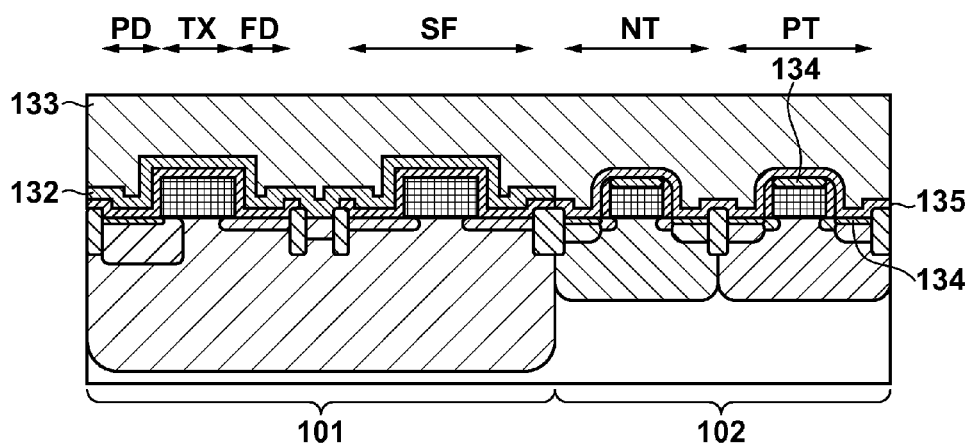

Next, as shown in FIG. 3F, in a salicide process, the insulation film 132 which is the single layer film made of the silicon oxide layer for protecting the pixel circuit section 101 is formed in the pixel circuit section 101. The insulation film 132 is formed to cover the opening 130. Subsequently, a silicide layer 134 such as the cobalt silicide is formed, upon silicidization of the gate electrodes by the salicide process, on the upper surfaces of the gate electrodes of the MOS transistors in the peripheral circuit section 102. If the silicide layer 134 is formed in the pixel circuit section 101 by the salicide process, an interface between the silicide layer 134 and the semiconductor substrate 100 can be a noise source. It is possible, however, to avoid the surface of the semiconductor substrate 100 (the surface of the impurity region 116) positioned under the opening 130 from being silicidized by performing the salicide process in state in which the insulation film 132 covers the opening 130. The surfaces of the source and drain of each MOS transistor in the peripheral circuit section 102 are also silicidized by cobalt or the like. Then, the insulation film 135 which functions as the etching stopper when forming the contact hole, and is the multilayered film made of the silicon oxide layer and the silicon nitride layer is formed in the peripheral circuit section 102. The insulation film 135 is formed in the peripheral circuit section 102 by using a patterning method, but is not formed in the pixel circuit section 101. Furthermore, the insulation film 133 made of a silicate glass such as a BPSG, and silicon oxide formed by a HDP-CVD method or the like is formed over the entire surfaces of the pixel circuit section 101 and the peripheral circuit section 102. The upper surface of the insulation film 133 is flattened by, for example, a reflow method, an etch back method, and a CMP method. The thermal diffusion and the activation of the impurity implanted in the impurity region 116 of the well contact are performed by annealing at 800° C. or more up to this step. This makes it possible to further reduce the contact resistance. Performing such annealing at a high temperature is difficult after forming a contact hole to be described later. Therefore annealing at a high temperature before forming the contact hole can be performed.

Figure 3G:
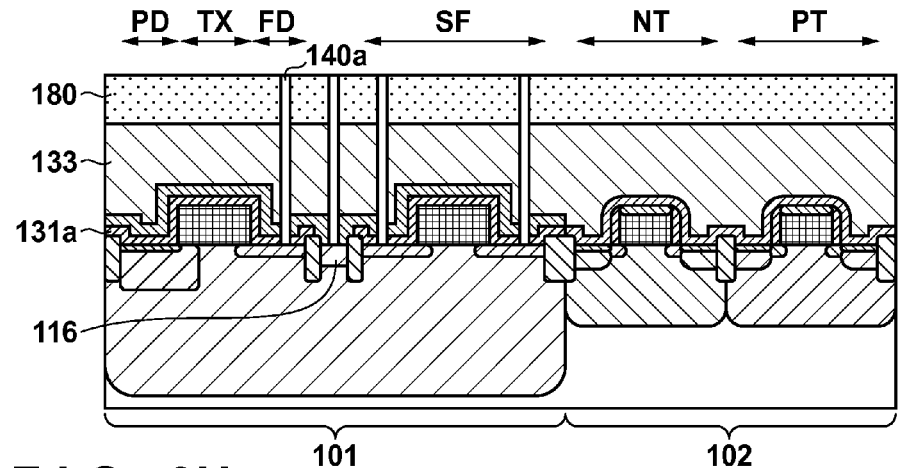

Next, as shown in FIG. 3G, a resist 180 having openings on the pixel circuit section 101 covers the pixel circuit section 101 and the peripheral circuit section 102. Contact holes 140a are formed by anisotropic dry etching using, as the etching stopper, the dielectric film 131a made of the silicon oxide layer and the silicon nitride layer in the pixel circuit section 101. Some of the plurality of contact holes 140a formed in the pixel circuit section 101 are formed in portions positioned on the impurity regions 116 of the insulation film 133. Some of the contact holes 140a are formed surrounded by the dielectric film 131a. The width (diameter) of each contact hole 140a can be made smaller than that of the opening 130. The contact holes are formed in a state in which the bottoms of the contact holes in the pixel circuit section 101 are in self alignment with the respective impurity regions. At this time, a portion exposed at the bottom of each contact hole can have an impurity concentration which is electrically connectable by a metal interconnection. Hence, an impurity may be implanted in, for example, the impurity regions 116, 114, and 115 through the contact holes. The impurity implanted in the impurity regions 114 and 115 through the contact holes 140a can be the same first conductivity type as that of the impurity regions 114 and 115. The impurity implanted in the impurity region 116 through the contact hole 140a may be the first conductivity type opposite to that of the impurity region 116 or the second conductivity type, or may be both of them.

Figure 3H:
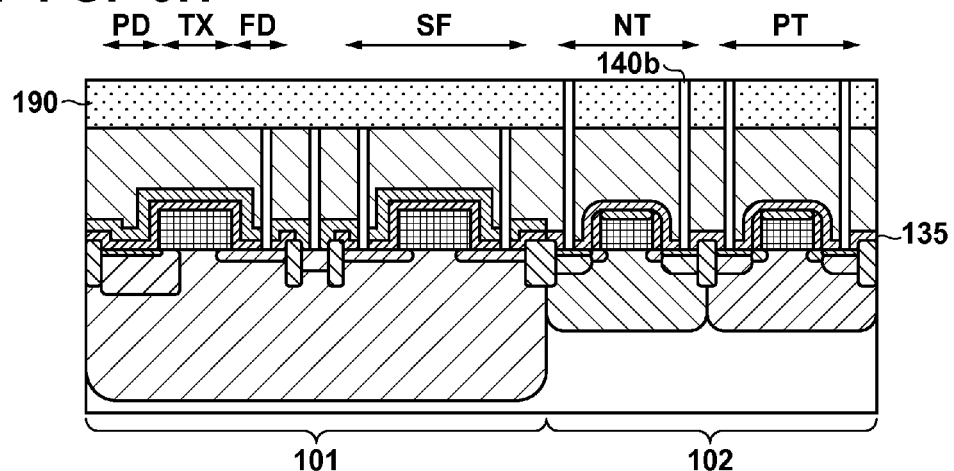
Figure 3I:
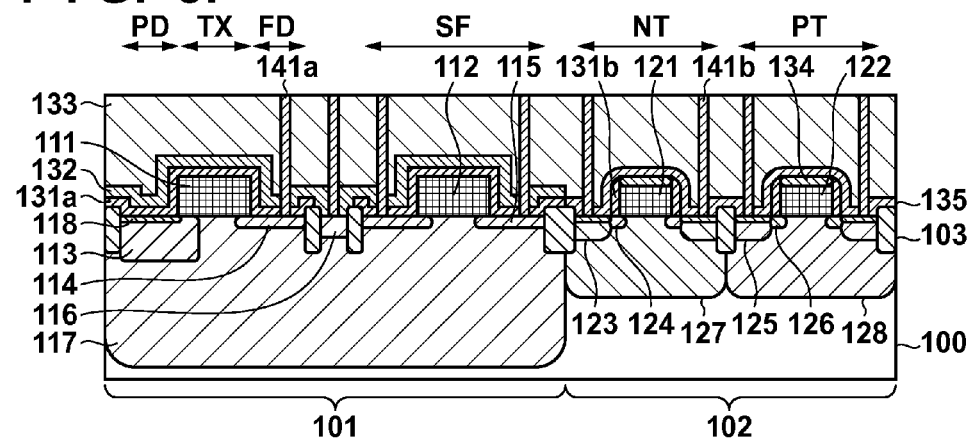

Next, as shown in FIG. 3H, after removing the resist 180, a resist 190 having openings on the peripheral circuit section 102 covers the pixel circuit section 101 and the peripheral circuit section 102. The resist 190 covers the contact holes 140a. Then, contact holes 140b are opened in the peripheral circuit section 102 by anisotropic dry etching using, as the etching stopper, the insulation film 135 made of the silicon oxide layer and the silicon nitride layer in the peripheral circuit section 102. Subsequently, the resist 190 is removed, and electrically conductive members are filled into the contact holes 140a and 140b to form the contact plugs 141a and 141b. By doing so, the photoelectric conversion apparatus 1 as shown in FIG. 3I is obtained. In this example, the contact holes 140b in the peripheral circuit section 102 are formed after forming the contact holes 140a in the pixel circuit section 101. However, the contact holes 140b may be formed before forming the contact holes 140a. By forming the contact holes 140a and 140b separately in this manner, it is possible to reduce the metal contamination of the impurity regions in the pixel circuit section 101 caused by the metal of the silicide layer 134. However, the contact holes 140b and the contact holes 140a may be formed simultaneously.

In the step of forming the side spacer 131b in the peripheral circuit section 102 by performing etch back, the dielectric film 131a in a portion positioned above the impurity region 116 in the pixel circuit section 101 is etched back simultaneously to form the openings 130. The step of forming the openings 130 above the impurity region 116 is performed together with the formation of the side spacers 131b. Furthermore, simultaneously with impurity implantation in regions that should be the source and drain of the MOS transistor of the second conductivity type in the peripheral circuit section 102, an impurity is also implanted in the impurity region 116. The step of implanting the impurity in the impurity region 116 can be performed together with another implantation step. This makes it possible to keep, by reducing the number of steps, the manufacturing cost lower as compared to a case in which the impurity region 116 is formed after forming the insulation film 133 such as the BPSG and then opening the contact holes. Moreover, with the addition of annealing after the impurity implantation in the impurity region 116, the impurity region 116 is activated and connected to the well 117 sufficiently. This makes it possible to decrease a contact resistance with the contact plug 141a. Since the resistance of the well contact can be reduced, a reference potential within an imaging area can further expected to be constant, and degradation in performance caused by shading can be suppressed.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-242363, filed Nov. 22, 2013, which is hereby incorporated by reference herein in its entirety.

What is claimed is:

1. A method of manufacturing a photoelectric conversion apparatus, the method comprising:
   forming a dielectric film for covering:
      a photoelectric conversion element and an amplification element, in a well of a pixel circuit section; and
      a MOS transistor in a peripheral circuit section; and
   forming, by etching the dielectric film, a side spacer by retaining a portion of the dielectric film on a side surface of a gate electrode of the MOS transistor while protecting, by a resist, a first portion and a second portion of the dielectric film, wherein the first portion covers the photoelectric conversion element and the second portion covers the amplification element,
   wherein an opening is formed in the dielectric film in the pixel circuit section with the etching of the dielectric film,
   wherein the etching for forming the side spacer and the etching for forming the opening are performed simultaneously,
   wherein a contact for defining a potential of the well is formed through the opening, and
   wherein the amplification element is configured to generate a signal based on an amount of charge generated in the photoelectric conversion element.

2. The method according to claim 1, wherein formation of the contact is performed by implanting an impurity in the well through the opening to form an impurity region of a higher impurity concentration than that of the well.

3. The method according to claim 2, wherein impurity implantation for forming a drain of the MOS transistor is performed simultaneously with impurity implantation for forming the impurity region.

4. The method according to claim 2, wherein a dose amount of impurity for forming the impurity region is $5 \times 10^{14}$ [ions/cm$^2$] (inclusive) to $5 \times 10^{16}$ [ions/cm$^2$] (inclusive).

5. The method according to claim 2, wherein the formation of the contact further comprises:
   forming a contact hole in a portion of an insulation film that is formed across the pixel circuit section and the peripheral circuit section, wherein the portion of the insulation film is positioned on the impurity region; and
   implanting an impurity in a region to be the impurity region through the contact hole.

6. The method according to claim 5, wherein a width of the contact hole is smaller than that of the opening.

7. The method according to claim 5, wherein an impurity of a conductivity type opposite to that of the impurity which has been implanted when forming the impurity region is implanted in the impurity region through the contact hole.

8. The method according to claim 5, wherein a contact hole is formed in a portion of the insulation film positioned on a drain of the MOS transistor before or after forming the contact hole on the impurity region.

9. The method according to claim 2, wherein in the formation of the contact, a contact plug connecting to the impurity region is formed.

10. The method according to claim 2, wherein the impurity region is surrounded by an insulator for element isolation.

11. The method according to claim 1, wherein impurity implantation for forming a drain of the MOS transistor and impurity implantation for forming the amplification element are performed simultaneously before forming the side spacer.

12. The method according to claim 1, wherein the dielectric film is a multi-layered film including a silicon oxide layer and a silicon nitride layer.

13. The method according to claim 1, wherein the dielectric film includes a silicon nitride layer containing hydrogen.

14. The method according to claim 1, further comprising silicidizing the MOS transistor after formation of a dielectric film covering the opening.

* * * * *